(12) United States Patent
Ito et al.

(10) Patent No.: US 11,355,364 B2
(45) Date of Patent: Jun. 7, 2022

(54) LASER TREATMENT DEVICE RECTIFIER DEVICE AND LASER TREATMENT DEVICE

(71) Applicant: JSW AKTINA SYSTEM CO., LTD., Yokohama (JP)

(72) Inventors: Daisuke Ito, Kanagawa (JP); Junichi Shida, Kanagawa (JP)

(73) Assignee: JSW AKTINA SYSTEM CO., LTD., Yokohama (JP)

(*) Notice: Subject to any disclaimer, the term of this patent is extended or adjusted under 35 U.S.C. 154(b) by 985 days.

(21) Appl. No.: 15/769,721

(22) PCT Filed: Oct. 25, 2016

(86) PCT No.: PCT/JP2016/081580
§ 371 (c)(1),
(2) Date: Apr. 19, 2018

(87) PCT Pub. No.: WO2017/073561
PCT Pub. Date: May 4, 2017

(65) Prior Publication Data
US 2018/0315627 A1 Nov. 1, 2018

(30) Foreign Application Priority Data
Oct. 26, 2015 (JP) .............................. JP2015-209516

(51) Int. Cl.
*H01L 21/67* (2006.01)
*B23K 26/14* (2014.01)
(Continued)

(52) U.S. Cl.
CPC .... *H01L 21/67115* (2013.01); *B23K 26/0622* (2015.10); *B23K 26/0738* (2013.01);
(Continued)

(58) Field of Classification Search
CPC .......................... B23K 26/142; B23K 26/354; B23K 26/1476; H01L 21/67115
See application file for complete search history.

(56) References Cited

U.S. PATENT DOCUMENTS 4,288,678 A * 9/1981 La Rocca .......... B23K 26/0643
219/121.65
5,293,023 A * 3/1994 Haruta ................. B23K 26/142
219/121.6
(Continued)

FOREIGN PATENT DOCUMENTS

CA 2458982 A1 1/2003
CN 102077322 A 5/2011
(Continued)

OTHER PUBLICATIONS

Machine translation of Japan Paten document No. 2005-74,466, Sep. 2021.*
(Continued)

*Primary Examiner* — Geoffrey S Evans
(74) *Attorney, Agent, or Firm* — Holtz, Holtz & Volek PC

(57) ABSTRACT

A laser treatment device performing treatment by irradiating a target object having a plate surface with laser light, including: a light-transmitting region transmitting laser light emitted onto the target object; a rectifier that has a rectifier surface separated from the target object and extending along the plate surface of the target object and outward from the end of the light-transmitting region; a gas supply unit that feeds a gas to a gap between one side of the rectifier surface and the light-transmitting region, in a position separated from the light-transmitting region; and a gas exhaust unit that exhausts, on the other side that is on the other side of the light-transmitting region from the one side, the gas present in a gap between the rectifier surface and the target object
(Continued)

from the gap, in a position separated from the light-transmitting region, thereby generating a stable local gas atmosphere.

18 Claims, 6 Drawing Sheets

(51) Int. Cl.
    *B23K 26/142*     (2014.01)
    *C03B 25/02*     (2006.01)
    *B23K 26/073*     (2006.01)
    *B23K 26/08*     (2014.01)
    *B23K 26/352*     (2014.01)
    *B23K 26/0622*     (2014.01)
    *B23K 26/354*     (2014.01)
    *H01L 21/02*     (2006.01)
    *B23K 103/00*     (2006.01)
    *B23K 101/40*     (2006.01)
    *B23K 101/18*     (2006.01)

(52) U.S. Cl.
    CPC .......... *B23K 26/083* (2013.01); *B23K 26/142* (2015.10); *B23K 26/1476* (2013.01); *B23K 26/352* (2015.10); *B23K 26/354* (2015.10); *C03B 25/02* (2013.01); *C03B 25/025* (2013.01); *H01L 21/02592* (2013.01); *H01L 21/02686* (2013.01); *B23K 2101/18* (2018.08); *B23K 2101/40* (2018.08); *B23K 2103/50* (2018.08); *H01L 21/02532* (2013.01); *H01L 21/02691* (2013.01)

(56) References Cited

U.S. PATENT DOCUMENTS

| | | | | |
|---|---|---|---|---|
| 6,731,371 | B1 * | 5/2004 | Shiraishi | G03B 27/52 250/492.2 |
| 8,575,515 | B2 | 11/2013 | Kawaguchi et al. | |
| 2003/0217809 | A1 * | 11/2003 | Morishige | B23K 26/12 156/345.5 |
| 2003/0224587 | A1 * | 12/2003 | Yamazaki | G02B 19/0014 438/487 |
| 2004/0238504 | A1 | 12/2004 | Aubry et al. | |
| 2008/0087640 | A1 * | 4/2008 | Miyairi | B23K 26/142 216/65 |
| 2008/0210675 | A1 * | 9/2008 | Sasaki | B23K 26/16 219/121.84 |
| 2008/0276864 | A1 * | 11/2008 | Koelmel | H01L 21/6838 118/500 |
| 2015/0079803 | A1 * | 3/2015 | Huang | H01L 21/02378 438/758 |

FOREIGN PATENT DOCUMENTS

| | | |
|---|---|---|
| CN | 102714150 A | 10/2012 |
| CN | 105562934 A | 5/2016 |
| EP | 1273382 A1 | 1/2003 |
| FR | 2826893 A1 | 1/2003 |
| JP | 52114491 U | 8/1977 |
| JP | 01261292 A | 10/1989 |
| JP | 07503904 A | 4/1995 |
| JP | 2002009435 A | 1/2002 |
| JP | 2002178174 A | 6/2002 |
| JP | 2002210582 A * | 7/2002 |
| JP | 2002210582 A | 7/2002 |
| JP | 2002217124 A | 8/2002 |
| JP | 2005074466 A * | 3/2005 |
| JP | 2016087639 A | 5/2016 |
| KR | 20160052433 A | 5/2016 |
| TW | 201618878 A | 6/2016 |
| WO | 9316838 A2 | 9/1993 |
| WO | 03004214 A1 | 1/2003 |
| WO | WO-2004060602 A1 * | 7/2004 .......... B23K 26/1435 |

OTHER PUBLICATIONS

English translation of the Written Opinion dated May 11, 2018 issued in International Application No. PCT/JP2016/081580.
Chinese Office Action dated Apr. 3, 2020 (and English translation thereof) issued in counterpart Chinese Application No. 201680062525.5.
Chinese Office Action dated Jul. 2, 2019 (and English translation thereof) issued in counterpart Chinese Application No. 201680062525.5.
International Search Report (ISR) dated Dec. 6, 2016 issued in International Application No. PCT/JP2016/081580.
Written Opinion dated Dec. 6, 2016 issued in International Application No. PCT/JP2016/081580.

* cited by examiner

LASER TREATMENT DEVICE RECTIFIER DEVICE AND LASER TREATMENT DEVICE

TECHNICAL FIELD

This invention relates to a laser treatment device rectifier device and a laser treatment device that allow a local gas atmosphere to be generated and a target object to be irradiated with laser light for treatment.

BACKGROUND ART

As a device performing annealing by irradiating a silicon semiconductor film or the like on a substrate with laser light, a device is known which performs annealing by generating a local gas atmosphere surrounding a region on the substrate irradiated with laser light.

FIG. 6 is a front view of a conventional related device. This device includes a laser introduction window 52 in a laser irradiation tube 51 that introduces laser light 50 to a substrate 70. Horizontal rectifier plates 53 and 54 are provided on both sides of the bottom of the laser irradiation tube 51, and the laser light 50 passes through a laser through-hole 51B that is a gap between the rectifier plates 53 and 54.

The substrate 70 is placed on a sample stage 60 that resides below the laser irradiation tube 51 and is movable in the horizontal direction. In this state, the rectifier plates 53 and 54 and the substrate 70 are a predetermined distance away from each other. The laser irradiation tube 51 has a gas feed hole 51A letting a predetermined gas in the laser irradiation tube 51 from the exterior. The gas supplied into the laser irradiation tube 51 is blown down through the laser light through-hole 51B, hits the substrate 70, and flows out through the gap between each of the rectifier plates 53 and 54 and the substrate 70, thereby generating a local gas atmosphere.

In addition, Patent Literature 1 proposes a laser annealing device including an atmosphere controller means surrounding a region irradiated with laser beams, a plurality of gas feed means that can feed different gases into the atmosphere controller means, and an exhaust adjuster means for exhausting the gas, which is supplied from the gas feed means into the atmosphere controller means, from an annealing chamber.

CITATION LIST

Patent Literature

[Patent Literature 1] Japanese Patent Laid-Open No. 2002-217124

SUMMARY OF INVENTION

Technical Problem

With conventional devices like that in Patent Literature 1, a gas atmosphere is generated, so that the gas is continuously ejected from around the laser light path toward a substrate. However, if a position to be irradiated with laser light is sprayed with a gas flow from above, a turbulent flow occurs in the position to be irradiated with laser light. Improvements have been made such that the sprayed gas flow becomes a laminar flow to avoid the turbulent flow, failing to prevent a turbulent flow from occurring due to the gas flow hitting the substrate. There has also been an attempt to ease the turbulent flow by decreasing the gas flow rate, which, however, makes it difficult to achieve the primary objective which is to generate a uniform atmosphere.

A turbulent flow of a gas causes fluctuations in gas pressure and temperature. Consequently, the optical refraction index related to laser light changes and the laser light intensity in the position to be irradiated with laser light becomes non-uniform, which hinders uniform laser light irradiation. Besides, if laser light irradiation causes Si steam or fine particles to occur from a Si semiconductor film or other substrates, the optical refraction index in the laser light path changes and laser light is blocked. In the state where a turbulent flow occurs or the flow rate is significantly low, it is difficult to exhaust, from the laser light path, such steam, fine particles, or other substances occurring from a substrate.

An object of this invention, which has been made to solve the above-mentioned conventional problems, is to provide a laser treatment device rectifier device and a laser treatment device that allow a gas flow to flow along a target object and a uniform atmosphere to be generated from a given type of gas.

Solution to Problem

In particular, among laser treatment device rectifier devices of the present invention, a first aspect of the present invention is a rectifier device configured to be provided to a laser treatment device performing treatment by irradiating a target object having a plate surface with laser light, including:

a rectifier that is disposed at an end of a light-transmitting region transmitting laser light emitted onto the target object held by the laser treatment device, and that has a rectifier surface separated from the target object and extending along the plate surface of the target object and outward from the light-transmitting region;

a gas supply unit that feeds a gas to a gap between one side of the rectifier surface and the light-transmitting region in a position separated from the light-transmitting region while the rectifier being disposed over the light-transmitting region; and a gas exhaust unit that exhausts, on the other side that is on the other side of the light-transmitting region from the one side, the gas present in a gap between the rectifier surface and the target object from the gap, in a position separated from the light-transmitting region while the rectifier being disposed over the light-transmitting region.

This invention enables, when installed in a laser treatment device, gas feeding and exhaust in positions separated from the gas light-transmitting region, so that a uniform flow rate and pressure distribution are produced around the irradiated region, thereby generating a stable local gas atmosphere.

In the laser treatment device rectifier device according to a second aspect of the present invention related to the first aspect of the present invention, the rectifier is of such a shape that it extends outward with respect to the entire edge of the light-transmitting region.

This invention provides a stable local gas atmosphere around the light-transmitting region.

In the laser treatment device rectifier device according to a third aspect of the present invention related to the first or second aspect of the present invention, the rectifier has such a size that the rectifier surface extends outward from the gas exhaust unit with respect to the light-transmitting region, and the gas exhaust unit includes a gas suction unit for suction of the gas from the gap.

This invention allows the gas from the entire atmosphere to be suctioned in a position on the external side than the suction position in the gas exhaust unit, thereby achieving cleaning.

A laser treatment device according to a fourth aspect of the present invention is a laser treatment device performing treatment by irradiating a target object having a plate surface with laser light, including:

a light-transmitting region transmitting the laser light emitted onto the target object held by the laser treatment device;

a rectifier that has a rectifier surface separated from the target object and extending along the plate surface of the target object and outward from an end of the light-transmitting region;

a gas supply unit that feeds a gas to a gap between one side of the rectifier surface and the light-transmitting region, in a position separated from the light-transmitting region; and a gas exhaust unit that exhausts, on the other side that is on the other side of the light-transmitting region from the one side, the gas present in a gap between the rectifier surface and the target object from the gap, in a position separated from the light-transmitting region.

This invention enables gas feeding and exhaust in positions separated from the light-transmitting region, so that a uniform flow rate and pressure distribution are produced around the irradiated region, thereby generating a stable local gas atmosphere.

In the laser treatment device according to a fifth aspect of the present invention related to the fourth aspect of the present invention, the laser light is in a line beam form on the target object, and the light-transmitting region is of a long-length shape having a minor axis and a major axis corresponding to the minor axis direction and major axis direction of the line beam form, respectively, and the rectifier has the rectifier surface extending outward from both ends of the minor axis of the light-transmitting region and both ends of the major axis of the light-transmitting region.

This invention provides a stable local gas atmosphere outer than the major axis direction and minor axis direction of the light-transmitting region.

In the laser treatment device according to a sixth aspect of the present invention related to the fourth or fifth aspect of the present invention, on the side of an end of the major axis of the light-transmitting region, the rectifier surface extends at least 20 mm outward in the major axis direction from an end of the major axis of the laser light.

This invention allows a local gas atmosphere to be generated outward from the major axis end of the laser light along the major axis direction, preventing the entire atmosphere from being affected. If the extension distance is less than 20 mm, it is susceptible to the area outer than the major axis end of the laser light. It should be noted that the extension distance is more preferably at least 50 mm.

In the laser treatment device according to a seventh aspect of the present invention related to any one of the fourth to sixth aspects of the present invention, the gas supply unit and the gas exhaust unit are provided in such a manner that a gas flow due to gas feeding and exhaust covers an irradiated region where the target object is irradiated with the laser light.

This invention allows the irradiated region where the target object is irradiated with the laser light to be covered by a laminar flow of the gas and disposed in a stable local gas atmosphere.

In the laser treatment device according to an eighth aspect of the present invention related to the seventh aspect of the present invention, the laser light is in a line beam form on the target object, and the light-transmitting region is of a long-length shape having a minor axis and a major axis corresponding to the minor axis direction and major axis direction of the line beam form, respectively, and the gas supply unit and the gas exhaust unit with the light-transmitting region therebetween perform gas feeding and exhaust, respectively with a length range extending off both ends of the major axis length of laser light on the irradiated surface.

This invention allows the irradiated region upon which laser light in the line beam form is incident to be accurately covered by a gas flow.

In the laser treatment device according to a ninth aspect of the present invention related to any one of the fourth to eighth aspects of the present invention, the rectifier has the rectifier surface extending, with respect to the light-transmitting region, to a position outer than a gas supply position in the gas supply unit on the one side, and to the gas exhaust unit on the other side.

This invention allows a laminar flow of the gas to be generated in a position outer than the gas supply position, preventing the gas from flowing into the entire atmosphere. It should be noted that, in this aspect, the gas suction unit can be provided on the other side of the rectifier surface.

In the laser treatment device according to a tenth aspect of the present invention related to any one of the fourth to ninth aspects of the present invention, the rectifier has the rectifier surface extending, with respect to the light-transmitting region, to a position outer than a gas exhaust position in the gas exhaust unit, and the gas exhaust unit includes a gas suction unit for suction of the gas from the gap.

This invention enables efficient gas exhaust by the gas suction unit and allows a more stable laminar flow to be generated in the gap, so that in the gas suction position, the gas around it can be suctioned as a laminar flow and floating substances can be removed.

In the laser treatment device according to an eleventh aspect of the present invention related to the tenth aspect of the present invention, the gas suction unit includes a gas exhaust path, which is in communication with the gap and carries the gas in a direction between a direction perpendicular to the rectifier surface and the outer direction of the gas exhaust unit.

This invention allows the gas in the gap to be suctioned and exhausted more efficiently.

In the laser treatment device according to a twelfth aspect of the present invention related to the tenth or eleventh aspect of the present invention, the length of a portion of the rectifier surface outer than a gas supply position of the gas supply unit is larger than the distance between the gas supply position and the gas exhaust position.

This invention includes the rectifier surface having a portion outer than the gas supply position and the portion extends long enough to accurately avoid entrance of the gas from the entire atmosphere. If the extension length is less than or equal to the distance between the gas supply position and the gas exhaust position, the aforementioned effect of removal cannot adequately be provided.

In the laser treatment device according to a thirteenth aspect of the present invention related to the twelfth aspect of the present invention, the length of a portion of the rectifier surface outer than a gas exhaust position of the gas exhaust unit is larger than the distance between the gas supply position and the gas exhaust position.

This invention includes the rectifier surface having a portion outer than the gas supply position and the portion is long enough to accurately achieve suction of the gas from the entire atmosphere with a stable laminar flow. If the extension length is less than or equal to the distance between the gas supply position and the gas exhaust position, the aforementioned effect of suction cannot stably be provided.

In the laser treatment device according to a fourteenth aspect of the present invention related to any one of the fourth to thirteenth aspects of the present invention, the gas supply unit includes a gas feed path, which is in communication with the gap and carries the gas in a direction between a direction perpendicular to the rectifier surface and the inner direction of the gas supply unit.

This invention allows the gas to be stably introduced to the gap, thereby stably generating a laminar flow of the gas in an early stage.

In the laser treatment device according to a fifteenth aspect of the present invention related to any one of the fourth to fourteenth aspects of the present invention, a movable device that moves the target object is further included, and a gas supply position in the gas supply unit is provided backward along the direction of the movement, and a gas exhaust position in the gas exhaust unit is provided forward along the direction of the movement, with respect to the direction of the movement.

This invention allows a local gas atmosphere to be generated along a surface of the target object before irradiation with laser light, while pushing floating substances and the like forward and exhausted, thereby achieving stable treatment.

In the laser treatment device according to a sixteenth aspect of the present invention related to the fifteenth aspect of the present invention, the movable device can travel in both directions, and switching between the gas supply unit and the gas exhaust unit can be achieved according to the travel direction.

This invention achieves, during movement of the target object in both directions, gas feeding and exhaust according to the direction of the movement.

In the laser treatment device according to a seventeenth aspect of the present invention related to any one of the fourth to sixteenth aspects of the present invention, a gas supply position in the gas supply unit is at least 50 mm away from the adjacent end of the laser light in an irradiation position.

In this invention, the gas supply position and the laser light irradiation position are distanced enough to generate a stable laminar flow of the gas around the irradiation position, thereby accurately avoiding a turbulent flow of the gas. If the distance does not satisfy a certain condition, it is difficult to accurately generate a stable laminar flow. It should be noted that the distance is more preferably at least 150 mm.

In the laser treatment device according to an eighteenth aspect of the present invention related to any one of the fourth to seventeenth aspects of the present invention, a gas exhaust position in the gas exhaust unit is at least 50 mm away from the adjacent end of the laser light in an irradiation position.

In this invention, laser light irradiation position and the gas exhaust position are distanced enough to generate a stable laminar flow of the gas around the irradiation position, thereby accurately avoiding a turbulent flow of the gas. If the distance does not satisfy a certain condition, it is difficult to accurately generate a stable laminar flow. It should be noted that the distance is more preferably at least 150 mm.

The distance between the gas supply position and the adjacent end of the laser light in the irradiation position, and the distance between the adjacent end of the laser light in the irradiation position and the gas supply position are preferably at least 20 mm, more preferably at least 50 mm.

In the laser treatment device according to a nineteenth aspect of the present invention related to any one of the fourth to eighteenth aspects of the present invention, the distance between the rectifier surface and the target object is in a range of 1 to 20 mm.

This invention allows the distance between the rectifier surface and the target object to be appropriately set, thereby providing a stable laminar flow of the gas.

In the laser treatment device according to a twentieth aspect of the present invention related to any one of the fourth to nineteenth aspects of the present invention, the target object has a non-single-crystal semiconductor layer and the treatment using the laser light is recrystallization.

Advantageous Effects of Invention

According to the present invention, a gas is not sprayed toward a target object in a region to be irradiated with laser light; thus, there is no cause of turbulence of a laminar flow of a given gas and a gas moves along a plate surface of the target object, thereby making the flow rate and pressure distribution uniform and generating a stable local gas atmosphere. Further, this allows steam, fine particles, or other substances from a target object to be exhausted toward one direction and can therefore be quickly removed from the laser light path. If there is a significant amount of substances, such as steam and fine particles, from a target object to be irradiated, a countermeasure to increase the flow rate can be taken.

In addition, a rectifier plate for forming a laminar flow can be designed to be long without a fold, allowing a more rectified current to be formed.

DESCRIPTION OF EMBODIMENTS

Embodiment 1

A laser treatment device 1 of one embodiment of the present invention will be described below with reference to the attached drawings.

Figure 1:
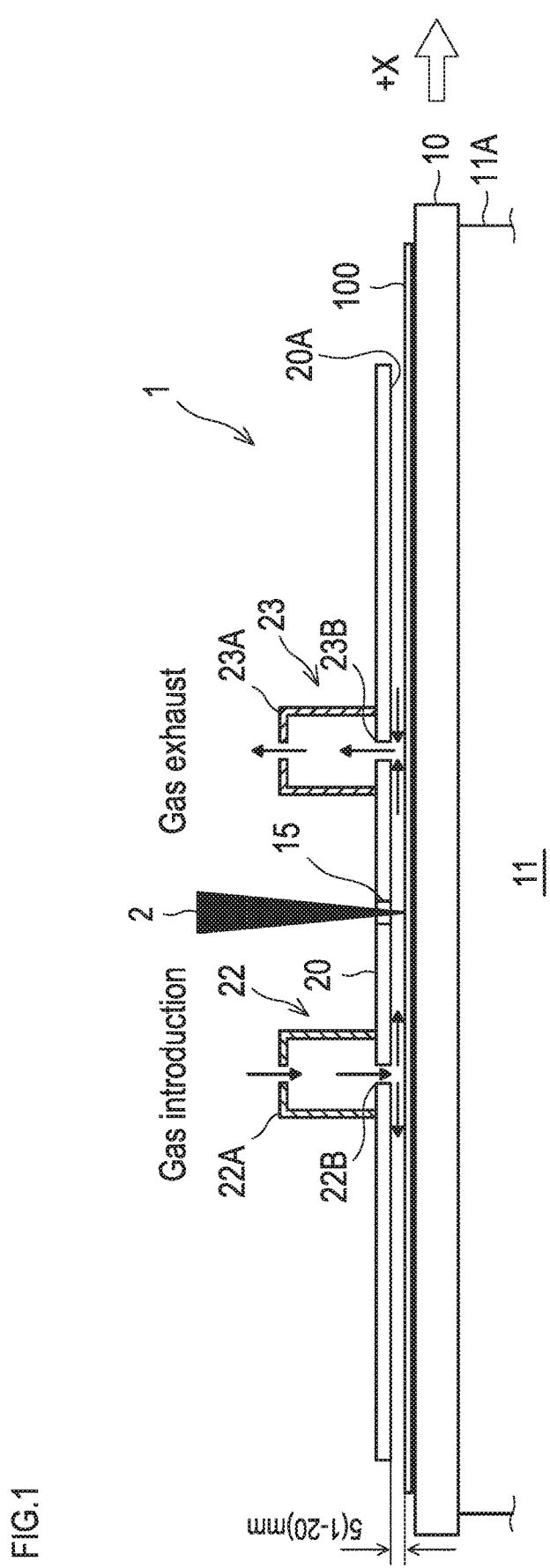
FIG. 1 is a front view of a laser treatment device according to one embodiment of the present invention.
Figure 2:
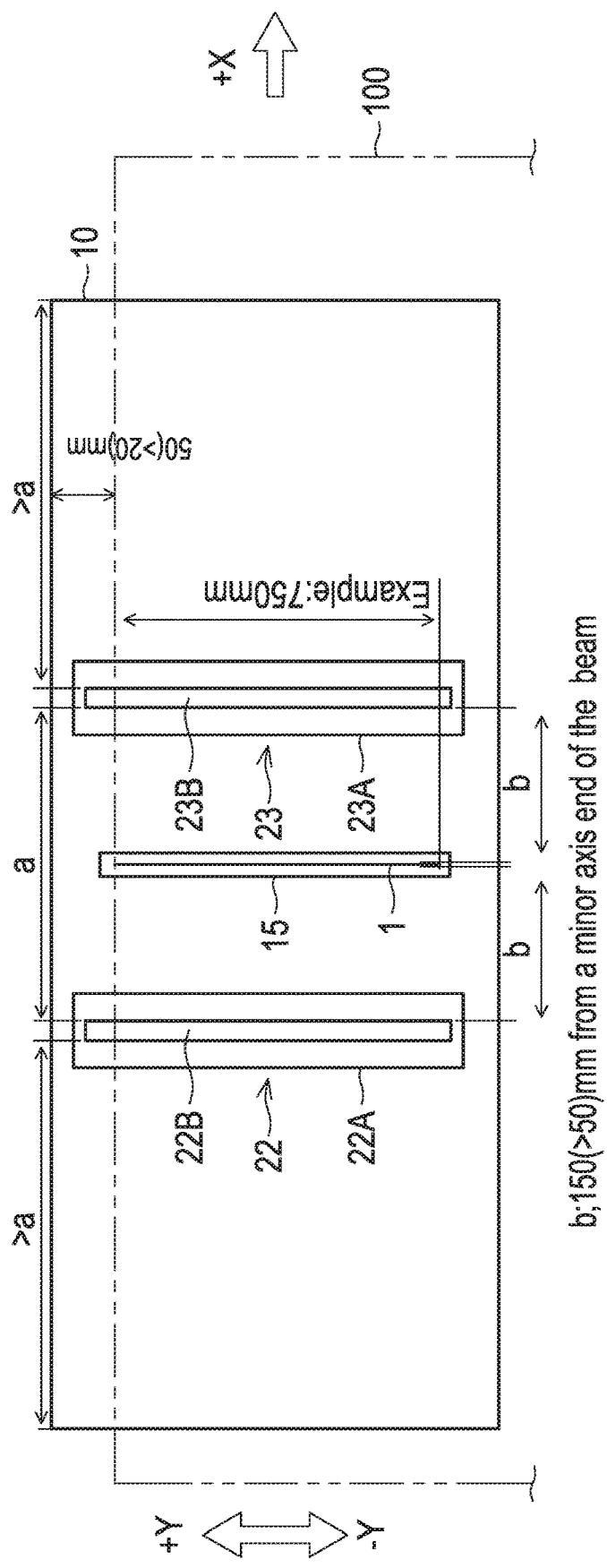
FIG. 2 is a plan view of the laser treatment device according to the embodiment of the present invention.

As shown in FIGS. 1 and 2, in the laser treatment device 1, a sample stage 10 having planar directional axes (X and Y) is placed on a movable stage 11A and is therefore movable in the right-left direction and front-back direction in the drawing, and a long-length laser light introduction window 15 is formed above the sample stage 10. The movable stage 11A is supposed to move the sample stage 10 through a driving device, which is not shown in the drawing, and the movable stage 11A and the driving device not shown in the drawing constitute a movable device 11 of the present invention.

It should be noted that, in the laser treatment device 1 of the present invention, a substrate 100, which will be described later, is placed on the sample stage 10. However, in the present invention, anything that can hold a target object can be used and the target object is not necessarily held by placement and can be held by a grasp, gas floating, or the like.

It is configured such that laser light 2 emitted from a laser light source (not shown in the drawing) and then formed into a line beam through an optical system (not shown in the drawing) enters the laser light introduction window 15 and is emitted downward.

The laser light 2 can be, for example, excimer laser light that is provided by "Vyper" (which is a product name) and has a wavelength of 308 nm and a pulse frequency of 600 Hz. In the present invention, laser light can be either continuous waves or pulsed light and have any frequency, or multiple types of laser light can be used.

As described above, the laser light 2 has a minor axis in the X direction and a major axis in the Y direction, and can be of, for example, a minor axis length of 0.155 to 0.450 mm and a major axis length of 370 to 1300 mm on the irradiated surface. This embodiment uses beam light of, for example, a minor axis length of 0.4 mm, a major axis length of 750 mm, and a minor axis-direction beam steepness of 70 µm on the irradiated surface. It should be noted that, in the present invention, the laser light can have any minor axis length, major axis length, and the like, and the beam sectional shape of the laser light is not limited to the line beam shape.

The laser light introduction window 15 corresponds to a light-transmitting region of the present invention. The laser light introduction window 15 has a long-length shape conforming to the beam sectional shape of the laser light. If laser light should be transmitted as it is, the major-axis length and the minor axis length are made larger than those of the beam sectional shape of the laser light. Further, the shape of the laser light introduction window 15 can be defined in such a manner that the end of one of or both of the minor axis and major axis of the laser light is shielded by the laser light introduction window 15. In this embodiment, the length of the laser light introduction window 15 along the major axis is larger than that of the transmitted laser light 2 by 25 mm on both sides.

The sample stage 10, which is movable as described above, enables relative scanning movement of the laser light 2 and irradiation with the laser light 2 by moving in the X direction. This allows the laser light 2 to scan the substrate 100 in the direction opposite to the travel direction of the sample stage 10.

The laser light introduction window 15 has a rectangular rectifier plate 20 therearound. The substrate 100 with a 50-nm-thick amorphous silicon semiconductor thin film (not shown in the drawing) formed thereon is disposed on the sample stage 10, and a rectifier surface 20A, which is the lower surface of the rectifier plate 20, extends in the X direction and is distanced from the semiconductor thin film. The distance, which is preferably in the range of 1 to 20 mm, is set to 5 mm in this embodiment. It should be noted that, in the present invention, there is no limitation on this distance and an appropriate distance can be set.

The substrate 100 with the semiconductor thin film formed thereon corresponds to a target object of the present invention. It should be noted that, in the present invention, the target object is not limited to a substrate with a semiconductor thin film thereon and can be anything that is subjected to any treatment involving irradiation with laser light.

The rectifier plate 20 is of such a width that it extends off both ends of the major axis length of the laser light 2, and is preferably of such a width that it extends from each end of the major axis of the laser light 2 by at least 20 mm. In this embodiment, it is of such a width that it extends outward from each major axis end of the laser light 2 by 50 mm.

In addition, the rectifier plate 20 has a gas feed hole 22B extending therethrough in the up-and-down direction in a position separated from the laser light introduction window 15 in the −X direction (toward the left in the drawing), and a gas suction hole 23B extending therethrough in the up-and-down direction in a position separated from the laser light introduction window 15 in the +X direction (toward the right in the drawing). The gas feed hole 22B and the gas suction hole 23B have a long-length shape that conforms to the sectional shape of the laser light 2 on the irradiated surface and is of such a length that each extends off both ends of the major axis of the laser light 2 on the irradiated surface. In addition, each is of such a length that it extends off both ends of the major axis of the laser light introduction window 15.

Further, the gas feed hole 22B and the gas suction hole 23B are preferably away from the adjacent minor axis end of the laser light 2 on the irradiated surface by a distance b that exceeds 50 mm. In this embodiment, the distance is 150 mm.

The top of the gas feed hole 22B is in communication with a gas feed tube 22A above the rectifier plate 20. The gas feed tube 22A except the gas inlet is sealed and the gas inlet is connected to a gas feed source not shown in the drawing. The gas feed source can feed a single gas or two or more gases mixed with a given mixture ratio and the type of gas can be changed according to the type of the target object or treatment. The type of the gas can be changed in the middle of treatment.

The flow rate of the gas supplied to the gas feed hole 22B can be fixed to a certain flow rate or the flow rate can be changed during treatment. The flow rate of the supplied gas can be, for example, 50 L/min. The gas feed hole 22B and the gas feed tube 22A constitute a gas supply unit 22.

The top of the gas suction hole 23B is in communication with a gas suction tube 23A above the rectifier plate 20. The gas suction tube 23A except the gas outlet is sealed and the gas outlet is connected to a gas suction device not shown in the drawing. The gas suction device can be operated according to gas feeding but can perform gas suction independently of the start of gas suction.

The gas suction hole 23B and the gas suction tube 23A constitute a gas suction unit 23. In this embodiment, the gas suction unit 23 serves as a gas exhaust unit.

The gas suction rate at the gas suction hole 23B preferably depends on the gas feed rate. A good balance between the gas suction rate and the gas feed rate can maintain pressure. If feeding and suction are performed for the entire atmosphere, the gas feed rate and the gas suction rate can be defined considering this, and feeding and suction match in the entire atmosphere.

The rectifier plate 20 extends outward from the gas feed hole 22B and the gas suction hole 23B with respect to the laser light introduction window 15, and outer ends of the rectifier plate 20 are away from the outer ends of the gas feed hole 22B and the gas suction hole 23B, respectively by a length (>a) larger than the distance (a) between the inner ends of the gas feed hole 22B and the gas suction hole 23B.

The rectifier plate 20, the gas supply unit 22, and the gas suction unit 23 constitute a rectifier device of the present invention.

It should be noted that the laser treatment device 1 includes, for example, a treatment chamber not shown in the drawing, the treatment chamber contains the movable device 11, the sample stage 10, and the rectifier device, and a laser light output source and an optical system are disposed outside the treatment chamber.

The operation of the laser treatment device 1 will now be explained.

The substrate 100 with an amorphous silicon semiconductor thin film on its upper surface is placed on the sample stage 10 as a target object.

The sample stage 10 is moved by the movable device 11 in the X-Y direction, thereby reaching the initial position. At this time, the destination of the sample stage 10 along the Y direction is determined such that a predetermined region of the substrate 100 along the Y direction overlaps the region irradiated with the laser light 2 and an end of the substrate 100 in the X direction is in the position irradiated with the laser light.

In this state, the gas supply unit 22 supplies the gas feed tube 22A with a predetermined gas and the gas is supplied from the gas feed hole 22B at a predetermined gas flow rate, while the gas suction unit 23 suctions the gas according to the gas feed rate. It should be noted that this embodiment uses nitrogen or other inert gases as the gas. Gas feeding and suction reduce the risk of a turbulent flow in the region irradiated with the laser light 2 and bring a laminar flow, thereby stabilizing the local gas atmosphere. In the initial stage of the treatment, the sample stage 10 does not exist below the suction hole 23B and the gas suction power is therefore low; for this reason, in the initial stage of the treatment, the suction rate can be increased in the gas suction unit 23.

The pulse laser light 2 is ejected from the laser light source, which is not shown in the drawing, and passes through the optical system to be a linear beam (line beam) that falls on the irradiated surface of the amorphous silicon semiconductor film on the substrate 100 through the laser light introduction window 15 at an appropriate irradiation energy density (e.g., 370 mJ·cm$^{-2}$).

The sample stage 10 is moved by the movable device 11 in the +X direction at a predetermined speed. This allows the laser light 2 to relatively perform scanning while being incident on the substrate 100.

In addition, with the rectifier plate 20, the gas supplied from the gas feed hole 22B in the above-described manner moves toward the gas suction hole 23B while causing a laminar flow, which provides a stable local gas atmosphere. Further, with the gas feed hole 22B, a laminar flow is formed flowing outward along the rectifier surface 20A, thereby preventing air and the like in the entire atmosphere from flowing from the exterior into the irradiated region. For a while even after laser light irradiation, the rectifier surface 20A provides a favorable local gas atmosphere and the effects of laser annealing proceed in a favorable manner, thereby enabling high-quality crystallization.

Further, with the gas feed hole 22B, a gas flow occurs on both sides along the rectifier surface 20A, thereby preventing air and the like from flowing from the exterior into the irradiated region. Moreover, with the gas suction hole 23B, the gas is suctioned from the exterior, and floating substances and the like in the entire atmosphere are suctioned and removed before laser light irradiation.

The amorphous silicon semiconductor film is moved by the sample stage 10, which moves according to the pulses of the laser light 2, in the +X direction at a constant speed while being irradiated with the laser light 2, so that the laser light 2 performs scanning and the irradiated surface moves; thus, a given region of the amorphous silicon semiconductor film is recrystallized through the irradiated surface. In addition, a stable local gas atmosphere enables favorable laser annealing.

Upon completion of treatment of the predetermined region of the substrate 100 along the Y direction, the movable device 11 moves the sample stage 10 in the Y direction (in FIG. 2, in the +Y direction) to perform the same treatment on different regions along the Y direction. At the time, the same treatment can be performed after the sample stage 10 is temporarily moved in the -X direction to return to the initial position, or irradiation with the laser light 2 can be done while the sample stage 10 is moved in the -X direction. When it should be moved in the opposite direction, the gas supply unit 22 and the gas suction unit 23 can be used without switching, or switching between the gas supply unit 22 and the gas suction unit 23 can be performed by piping switch or the like in such a manner that the gas suction unit lies in front of the gas supply unit when viewed from the -X direction. Alternatively, after treatment of the predetermined region of the substrate 100 along the Y direction, the sample stage 10 can be turned by 180° such that different regions of the substrate 100 along the Y direction are irradiated with the laser light.

Although the amorphous semiconductor film is irradiated with laser light for recrystallization in this embodiment, this embodiment can be widely applied to treatment involving irradiation with laser light for any other purposes.

Embodiment 2

Another embodiment will now be described with reference to FIG. 3. It should be noted that the same component as that in the above embodiment is denoted by the same reference numeral as it, for omission or simplification of description.

Although in Embodiment 1, the substrate 100 is irradiated with vertical laser light for laser annealing, the surface of the substrate 100 can be irradiated with oblique laser light.

Figure 3:
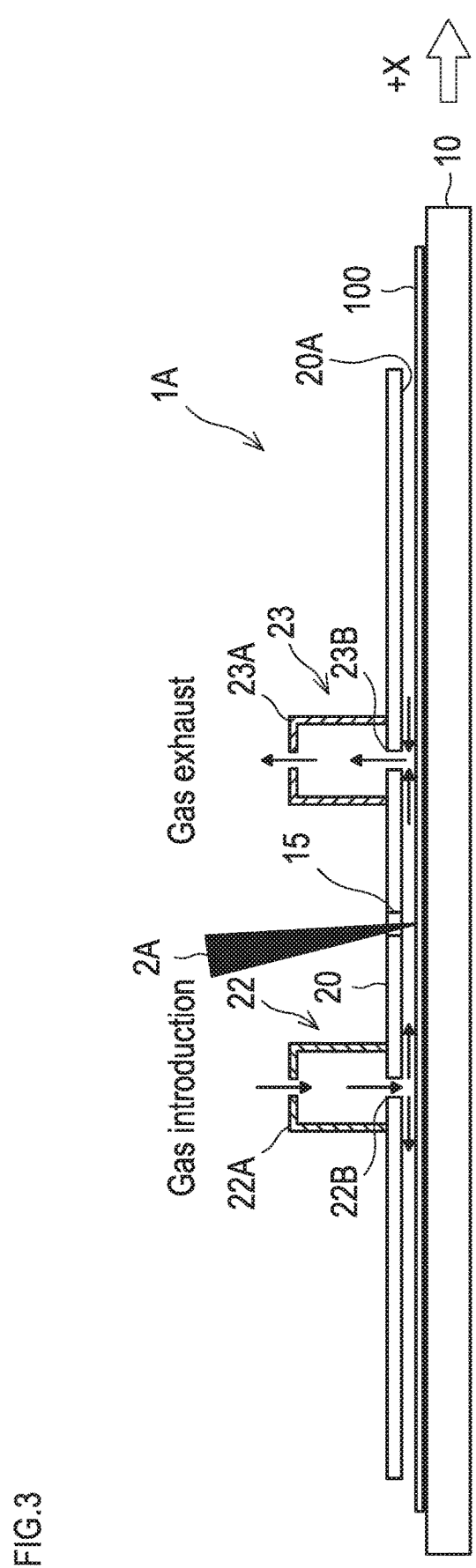
FIG. 3 is a front view of a laser treatment device according to another embodiment of the present invention.

In a laser treatment device 1A in FIG. 3, with respect to the sample stage 10 moving in the X direction, the substrate 100 is irradiated, through the laser light introduction window 15, with laser light 2A tilted diagonally forward. Embodiment 2 also enables laser annealing in a stable local gas atmosphere.

Embodiment 3

Figure 4:
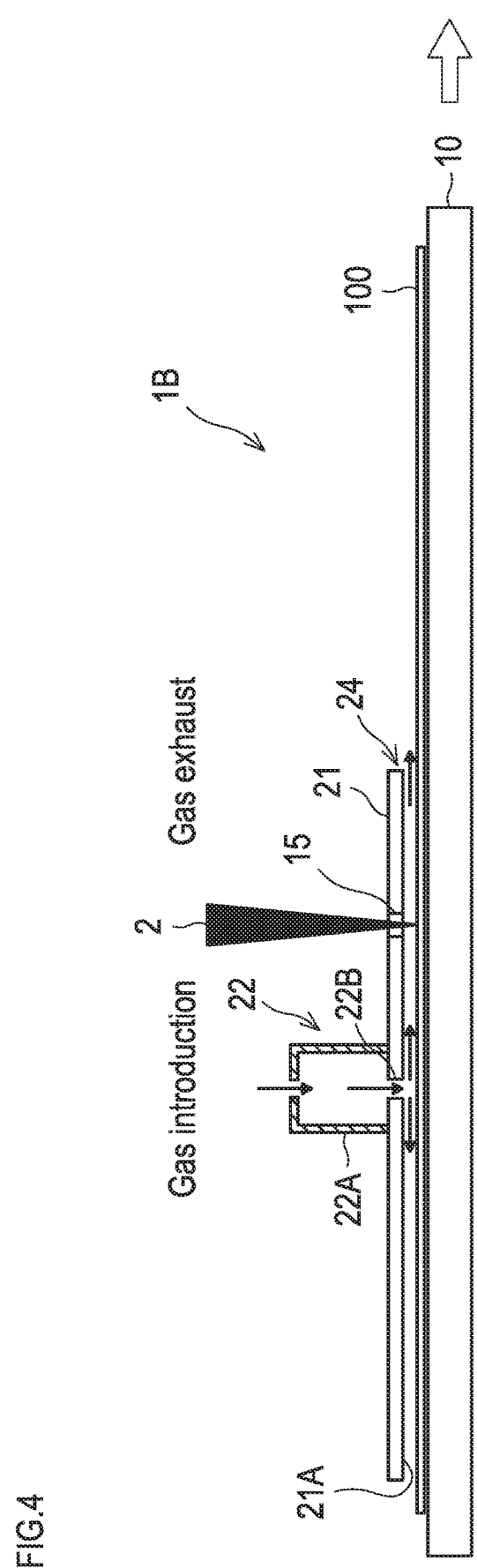
FIG. 4 is a front view of a laser treatment device according to still another embodiment.

Although the gas suction unit is essential in the aforementioned embodiments, the gas suction unit cannot necessarily be provided. Embodiment 3 will now be described with reference to FIG. 4. It should be noted that the same component as that in the above embodiments is denoted by the same reference numeral as it, for omission or simplification of description.

In a laser treatment device 1B in this embodiment, a rectifier plate 21 having a shorter length on the gas ejection side is provided around the laser light introduction window 15.

As in the aforementioned embodiments, the distance between a rectifier surface 21A, which is the lower surface of the rectifier plate 21, and the substrate 100 is set to 5 mm. In addition, the rectifier plate 21 has a width extending off both ends of the major axis length of the laser light 2, and Y has a width extending outward from each end of the major axis of the laser light 2 by at least 50 mm.

The gas feed hole 22B has a long-length shape that conforms to the sectional shape of the laser light 2 on the irradiated surface and is of such a length that it extends off both ends of the major axis of the laser light 2 on the irradiated surface. The gas feed hole 22B is 250 mm away from the adjacent minor axis end of the laser light 2 on the irradiated surface, and its other side in the rectifier plate 21 is 250 mm away from the adjacent minor axis end of the laser light 2 on the irradiated surface. The end of the other side in the rectifier plate 21 constitutes a gas exhaust unit 24 from which the gas is exhausted.

The top of the gas feed hole 22B is in communication with the gas feed tube 22A above the rectifier plate 21.

The rectifier plate 21 extends outward from the gas feed hole 22B with respect to the laser light introduction window 15, and an outer end of the rectifier plate 21 is away from the outer end of the gas feed hole 22B, by a length larger than the distance between the outer end of the gas feed hole 22B and the end of the other side of the rectifier plate 21.

The rectifier plate 21 and the gas supply unit 22 constitute a rectifier device of the present invention.

Also in this embodiment, the gas supplied from the gas supply unit 22 passes between the rectifier surface 21A and the substrate 100 toward the gas exhaust unit 24 and forms a laminar flow, which allows a stable local gas atmosphere to be formed and enables favorable annealing. In addition, an outward laminar flow occurs outer than the gas supply position of the gas supply unit 22, preventing the gas flowing in from the entire external atmosphere.

Embodiment 4

Although a gas is vertically fed downward from above the substrate 100 and is suctioned directly upward in the aforementioned embodiments, the gas can be fed obliquely toward the substrate 100 and obliquely suctioned.

Figure 5:
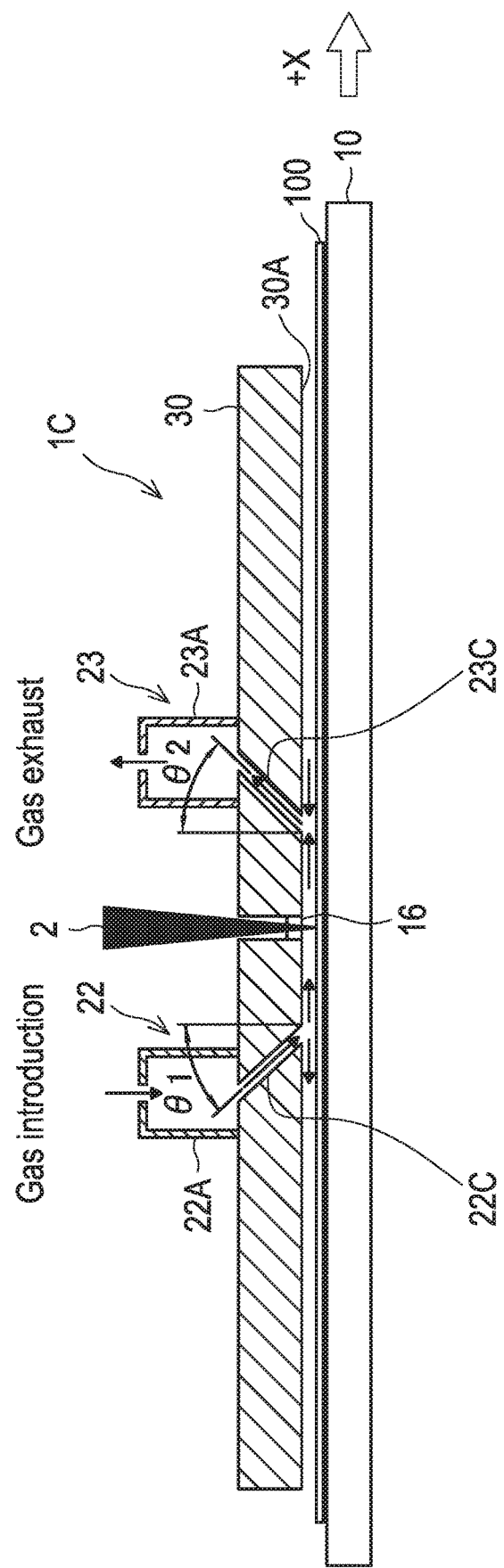
FIG. 5 is a front view of a laser treatment device according to yet another embodiment.
Figure 6:
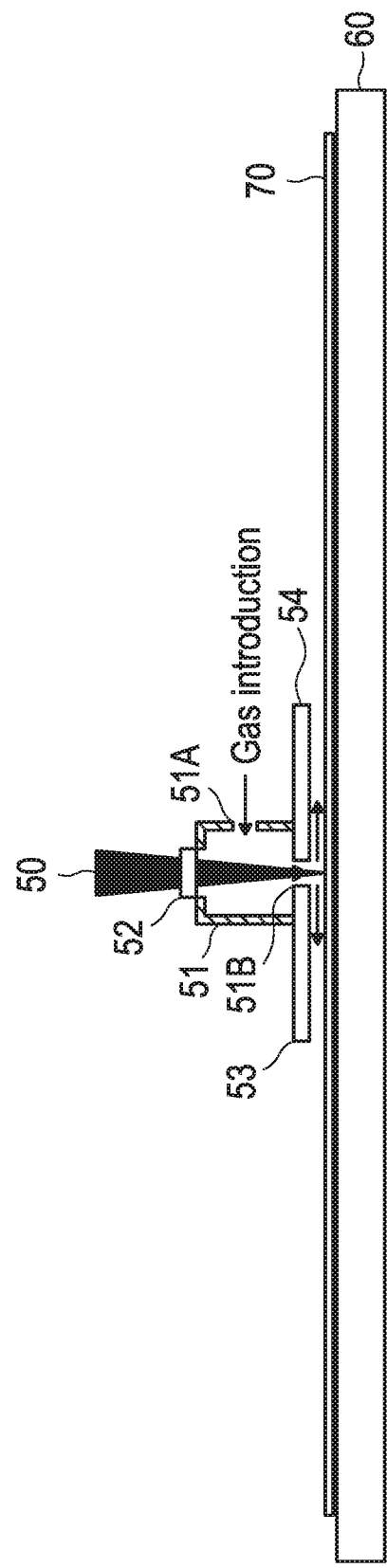
FIG. 6 is a front view of a conventional laser treatment device.

A laser treatment device 1C of this embodiment will now be described with reference to FIG. 5. It should be noted that the same component as that in the above embodiments is denoted by the same reference numeral as it, for omission or simplification of description.

In a laser treatment device 1C, a long-length laser light introduction window 16 is disposed above the sample stage 10. The laser light introduction window 16 corresponds to a light-transmitting region of the present invention.

The laser light introduction window 16 has a long-length shape conforming to the beam sectional shape of the laser light.

The laser light introduction window 16 has a rectangular rectifier plate 30 therearound. A rectifier surface 30A, which is the lower surface of the rectifier plate 30, is 5 mm from the amorphous silicon semiconductor film and extends in the X direction.

The rectifier plate 30 has a width extending off both ends of the major axis length of the laser light 2, and has a width extending outward from each end of the major axis of the laser light 2 by 50 mm.

In addition, the rectifier plate 30 has a gas feed hole 22C extending therethrough in the up-and-down direction and separated from the laser light introduction window 16 in the −X direction (toward the left in the drawing), and a gas suction hole 23C extending therethrough in the up-and-down direction and separated from the laser light introduction window 16 in the +X direction (toward the right in the drawing). The gas feed hole 22C and the gas suction hole 23C have a long-length shape that conforms to the sectional shape of the laser light 2 on the irradiated surface and is of such a length that it extends off both ends of the major axis of the laser light 2 on the irradiated surface.

Lower ends of the gas feed hole 22C and the gas suction hole 23C are preferably away from the adjacent minor axis end of the laser light 2 on the irradiated surface by a distance exceeding 150 mm. In this embodiment, the distance is 250 mm.

The gas feed hole 22C is tilted at such an angle that its lower end approaches the laser light introduction window 16, and the angle is referred to as angle $\theta 1$ that is preferably more than 0° and less than or equal to 60° to the vertical direction of the rectifier plate 30.

The gas suction hole 23C is tilted at such an angle that its lower end approaches the laser light introduction window 16, and the angle is referred to as angle $\theta 2$ that is preferably more than 0° and less than or equal to 60° to the vertical direction of the rectifier plate 30.

The gas feed hole 22C is in communication with the gas feed tube 22A over the rectifier plate 30, and the gas feed hole 22C and the gas feed tube 22A constitute the gas supply unit 22.

The gas suction hole 23C is in communication with the gas suction tube 23A over the rectifier plate 30, and the gas suction hole 23C and the gas suction tube 23A constitute the gas suction unit 23.

The rectifier plate 30 extends outward from the gas feed hole 22C and the gas suction hole 23C with respect to the laser light introduction window 16, and outer ends of the rectifier plate 30 are away from the outer ends of the gas feed hole 22C and the gas suction hole 23C, respectively by a length larger than the distance between the inner ends of the gas feed hole 22C and the gas suction hole 23C.

The rectifier plate 30, the gas supply unit 22, and the gas suction unit 23 constitute a rectifier device of the present invention.

In this embodiment, the gas feed hole 22C feeds a gas obliquely forward, so that a laminar flow is smoothly formed between the rectifier surface 30A and the glass substrate 100.

A laminar flow of the gas is suctioned obliquely upward through the gas suction hole 23C, providing an effect of smooth exhaust of the gas between the rectifier surface 30A and the glass substrate 100.

Although the present invention has been described based on the aforementioned embodiments, the present invention is not limited to the description of the aforementioned embodiments and appropriate modifications of the aforementioned embodiments can be made without departing from the scope of the present invention.

This application claims the benefit of priority from Japanese Patent Application No. 2015-209516, filed on Oct. 26, 2015; the entire contents of which are incorporated herein by reference.

REFERENCE SIGNS LIST 1 laser treatment device
1A laser treatment device
1B laser treatment device
1C laser treatment device
2 laser light
3 laser light
10 sample stage
11A movable stage
11 movable device
20 rectifier plate
20A rectifier surface
21 rectifier plate
21A rectifier surface
22 gas supply unit
22A gas feed tube
22B gas feed hole
22C gas feed hole
23 gas suction unit
23A gas suction tube
23B gas suction hole
23C gas suction hole
24 gas exhaust unit
30 rectifier plate
30A rectifier surface

The invention claimed is:

1. A rectifier device configured to be provided to a laser treatment device performing treatment by irradiating a target object having a plate surface with laser light, the rectifier device comprising:
   a rectifier that is disposed at an end of a light-transmitting region transmitting laser light emitted onto the target object held by the laser treatment device, and that has a rectifier surface separated from the target object and extending along the plate surface of the target object and outward from the light-transmitting region;
   a gas supply unit having a gas feed path and a gas feed hole, the gas supply unit feeding a gas from a gas feed source through the gas feed path and the gas feed hole to a gap between the rectifier surface and the target object, the gas feed hole being formed through the rectifier at a first position outside of the light transmitting region, the gas feed hole being independent of and separated from the light-transmitting region by a solid continuous surface, and the gas supply feeding unit feeding the gas to the gap while the rectifier is disposed over the light-transmitting region; and
   a gas exhaust unit having a gas suction path and a gas suction hole, the gas exhaust unit exhausting the gas present in the gap between the rectifier surface and the target object, from the gap, through the gas suction hole and the gas suction path by a gas suction device, the gas suction hole being formed through the rectifier at a second position outside of the light transmitting region, the gas suction hole being independent of and separated from the light-transmitting region by a solid continuous surface, the second position being opposite the first position such that the light-transmitting region is provided between the gas feed hole and the gas suction hole, and the gas exhaust unit exhausting the gas from the second gap while the rectifier is disposed over the light-transmitting region,
   wherein:
   the laser light is in a line beam form on an irradiated region where the target object is irradiated by the laser light, and the light-transmitting region is of a long-length shape having a minor axis and a major axis respectively corresponding to a minor axis direction and a major axis direction of the line beam form,
   the rectifier surface extends outward from both ends of the light-transmitting region along the minor axis direction and both ends of the light-transmitting region along the major axis direction, and
   each of the gas feed hole and the gas suction hole has a long-length shape that corresponds to a sectional shape of the laser light on the irradiated region and has such a size so as to extend beyond both ends of the laser light on the irradiated region along the major axis direction.

2. The laser treatment device rectifier device according to claim 1, wherein the rectifier is of such a shape that the rectifier extends outward with respect to an entire length of the light-transmitting region.

3. The laser treatment device rectifier device according to claim 1, wherein the rectifier has such a size that the rectifier surface extends outward from the gas exhaust unit with respect to the light-transmitting region.

4. A laser treatment device performing treatment by irradiating a target object having a plate surface with laser light, the laser treatment device comprising:
   a light-transmitting region transmitting the laser light emitted onto the target object held by the laser treatment device;
   a rectifier that has a rectifier surface separated from the target object and extending along the plate surface of the target object and outward from the light-transmitting region;
   a gas supply unit having a gas feed path and a gas feed hole, the gas supply unit feeding a gas from a gas feed source through the gas feed path and the gas feed hole to a gap between the rectifier surface and the target object, the gas feed hole being formed through the rectifier at a first position outside of the light transmitting region, and the gas feed hole being independent of and separated from the light-transmitting region by a solid continuous surface; and
   a gas exhaust unit having a gas suction path and a gas suction hole, the gas exhaust unit exhausting the gas present in the gap between the rectifier surface and the target object, from the gap, through the gas suction hole and the gas suction path by a gas suction device, the gas suction hole being formed through the rectifier at a second position outside of the light transmitting region, the gas suction hole being independent of and separated from the light-transmitting region by a solid continuous surface, and the second position being opposite the first position such that the light-transmitting region is provided between the gas feed hole and the gas suction hole,
   wherein:
   the laser light is in a line beam form on an irradiated region where the target object is irradiated by the laser light, and the light-transmitting region is of a long-length shape having a minor axis and a major axis respectively corresponding to a minor axis direction and a major axis direction of the line beam form,
   the rectifier surface extends outward from both ends of the light-transmitting region along the minor axis direction and both ends of the light-transmitting region along the major axis direction, and
   each of the gas feed hole and the gas suction hole has a long-length shape that corresponds to a sectional shape of the laser light on the irradiated region.

5. The laser treatment device according to claim 4, wherein a distance between the rectifier surface and the plate surface of the target object is in a range of 1 to 20 mm.

6. The laser treatment device according to claim 4, wherein, on a side of an end of the light-transmitting region along the major axis direction, the rectifier surface extends at least 20 mm outward from an end of the laser light along the major axis direction.

7. The laser treatment device according to claim 4, wherein the gas supply unit and the gas exhaust unit are provided in such a manner that a gas flow due to gas feeding and exhaust covers the irradiated region.

8. The laser treatment device according to claim 7, wherein:
the gas supply unit and the gas exhaust unit perform gas feeding and exhaust, respectively, and
a length of each of the gas supply unit and the gas exhaust unit extends beyond both ends of the laser light on the irradiated region along the major axis direction.

9. The laser treatment device according to claim 4, wherein the rectifier surface extends, with respect to the light-transmitting region, to a position beyond a gas supply position of the gas supply unit on the first side, and to a position beyond the gas exhaust unit on the second side.

10. The laser treatment device according to claim 4, wherein the rectifier surface extends, with respect to the light-transmitting region, to a position beyond a gas exhaust position of the gas exhaust unit.

11. The laser treatment device according to claim 10, wherein the gas suction path is in communication with the gap via the gas suction hole and carries the gas in a direction between a direction perpendicular to the rectifier surface and an outer direction of the gas exhaust unit.

12. The laser treatment device according to claim 10, wherein a length of a portion of the rectifier surface that is outward of a gas supply position of the gas supply unit is larger than a distance between the gas supply position and the gas exhaust position.

13. The laser treatment device according to claim 12, wherein a length of a portion of the rectifier surface that is outward of the gas exhaust position of the gas exhaust unit is larger than the distance between the gas supply position and the gas exhaust position.

14. The laser treatment device according to claim 4, wherein the gas feed path is in communication with the gap via the gas feed hole and carries the gas in a direction between a direction perpendicular to the rectifier surface and an inner direction of the gas supply unit.

15. The laser treatment device according to claim 4, further comprising a movable device that moves the target object,
wherein a gas supply position in the gas supply unit is provided backward along a direction of movement of the target object, and a gas exhaust position in the gas exhaust unit is provided forward along the direction of the movement.

16. The laser treatment device according to claim 15, wherein the movable device is movable in opposite directions, and switching between supplying gas by the gas supply unit and exhausting gas by the gas exhaust unit can be achieved according to a travel direction of the movable device.

17. The laser treatment device according to claim 4, wherein a gas supply position in the gas supply unit is at least 50 mm away from an adjacent end of the laser light in the irradiated region.

18. The laser treatment device according to claim 4, wherein a gas exhaust position in the gas exhaust unit is at least 150 mm away from an adjacent end of the laser light in the irradiated region.

* * * * *